(12) United States Patent
Reefman

(10) Patent No.: US 6,606,043 B2
(45) Date of Patent: Aug. 12, 2003

(54) METHOD AND ARRANGEMENT FOR SYNCHRONIZING A SIGMA DELTA-MODULATOR

(75) Inventor: Derk Reefman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/925,334

(22) Filed: Aug. 9, 2001

(65) Prior Publication Data

US 2002/0036578 A1 Mar. 28, 2002

(30) Foreign Application Priority Data

Aug. 11, 2000 (EP) .............................................. 00202829

(51) Int. Cl.$^7$ .............................................. H03M 1/66
(52) U.S. Cl. ........................................ 341/143; 341/144

(58) Field of Search .................................. 341/143, 144

(56) References Cited

U.S. PATENT DOCUMENTS

| | | | | |
|---|---|---|---|---|
| 5,736,950 A | * | 4/1998 | Harris et al. | 341/143 |
| 6,061,008 A | * | 5/2000 | Abbey | 341/143 |
| 6,362,762 B1 | * | 3/2002 | Jensen et al. | 341/143 |

* cited by examiner

*Primary Examiner*—Peguy JeanPierre
*Assistant Examiner*—Joseph Lauture
(74) *Attorney, Agent, or Firm*—Steven R. Biren

(57) ABSTRACT

A method and arrangement for bit-synchronizing a $\Sigma\Delta$-modulator uses a pre-filter to filter an incoming single bit bitstream. One or more of the integrator states of the $\Sigma\Delta$-modulator are corrected by a signal which is calculated from the incoming bitstream and at least one of the pre-filtered input signal and the output bitstream of the $\Sigma\Delta$-modulator.

5 Claims, 4 Drawing Sheets

METHOD AND ARRANGEMENT FOR SYNCHRONIZING A SIGMA DELTA-MODULATOR

BACKGROUND OF THE INVENTION

This invention relates to a method of synchronizing a ΣΔ-modulator comprising a low pass filter and a quantizer in feedback arrangement, to an incoming single-bit bitstream, the method comprising the step of generating a correction signal from said incoming bitstream and adding said correction signal to at least one of the integrator stages of the low pass filter. Such method is known from a paper entitled: "Digital Signal Processing in Direct Stream Digital Editing System" by M. Noguchi et al presented to the 102nd AES Convention, held on Mar. 22–25, 1997 in Munich, Germany.

In current A/D and D/A conversion, ΣΔ-modulators are frequently used because of the high linearity of their output signals compared to those of conventional PCM converters. The basic idea of the use of ΣΔ-modulators is that the quantizer step can be made rather course, and that the loss in precision due to this approach is corrected for by oversampling. Oversampling itself is not enough to retain the quality mandatory for audio applications, and noise shaping is applied. The basic principle of noise shaping is to use a low pass filter in a feedback loop with the quantizer, in order to minimize the errors made in the quantizing step. For audio applications, an oversampling ratio of 64 is sufficient for high noise suppression, i.e. the clock frequency of the ΣΔ-modulator is 64*44.1 kHz. Additionally, the high clock frequency provides a large bandwidth of the signal and removes the need for steep anti-aliasing filters.

For these reasons this single-bit format is adopted as the audio carrier format for the new generation of audio cd's (Super Audio CD=SACD), in contrast to the multi-bit format which use many bits (e.g. 16 or 20) for the amplitude quantization and which run at sample frequencies marginally higher than the Nyquist frequency of the input signal. In the latter case, the input signal creates a unique sequence of bit-patterns (PCM). In the case of a ΣΔ-modulator, on the contrary, only the average of the bit-pattern is unique; the sequence of the bits themselves is irrelevant. This implies that, when two identical ΣΔ-modulators are fed with identical signals, but the initial states of the integrators are different, then the mere fact that these states are different results in two different bitstreams which never converge to identical bit-patterns.

As a result hereof, many signal processing routes (mixing, editing etc.) using single-bit bitstreams (often called DSD= Direct Stream Digital signals) do not work as with PCM, because signals are not bit-synchronised, i.e. the bits of the bitstreams are not simultaneously equal to each other. Another issue, arising from the same problem of the difficulty of synchronization, is in compression, where, in some way, the bitstream needs to be predicted. Without bit-synchronization, even a ΣΔ-modulator with exactly the same input may produce a completely different output.

This synchronization problem could be circumvented by converting the single-bit signal to a low rate multi-bit (PCM) signal, subsequently carrying out the required signal processing and then reconverting the multi-bit signal to the required single-bit format. However, this would result in serious signal degradation, due to the steep anti-aliasing pre-filters which are required in these signal translations. In case the signal is converted to a high rate PCM-signal, then the stability of the reconversion ΣΔ-modulator requires a pre-filter with a low cutoff frequency, which also results in significant loss of signal quality.

The above referenced paper discloses an editing system for single-bit bitstreams, in which a first bitstream is selected for outputting and thereafter a second bitstream. There between the output of a ΣΔ-modulator is selected, which receives the faded-out first signal and the faded-in second signal. For bit-synchronizing the ΣΔ-modulator to the second bitstream the offset between the second bitstream and the sum of the two faded signals is stored in an accumulator and, when the fading is completed, the stored offset is added little by little to the input of the ΣΔ-modulator during an offset elimination time. It may be noted that adding the accumulated offset to the input of the ΣΔ-modulator is equivalent to adding the offset to the first integrator stage of the low pass filter of the ΣΔ-modulator. After the offset elimination time, the output is switched from the ΣΔ-modulator to the second bitstream. The object of this synchronization procedure is to avoid clicks, which would otherwise occur at the switch-over from the requantized bitstream delivered by the ΣΔ-modulator to the second bitstream.

However in this prior art system, when the audio content at the input of the ΣΔ-modulator is small the input- and output-bitstreams of the ΣΔ-modulator can easily be in anti-phase, so that the required bit-synchronization is not achieved. Moreover, the prior art system cannot be used when the relation of the incoming signal with the original bitstream is lost (e.g. after substantial signal processing). The present invention seeks to improve the bit-synchronization of a ΣΔ-modulator to an incoming single-bit bitstream and therefore the method according to the invention is characterized by pre-filtering the incoming bitstream prior to application to the ΣΔ-modulator and by generating the correction signal additionally from at least one of the pre-filtered input signal and the outgoing bitstream of the ΣΔ-modulator. Therefore, by calculating the correction signal from both the incoming bitstream and at least one of the in- and output signals of the ΣΔ-modulator, a much more reliable bit-synchronization of the ΣΔ-modulator is obtained.

SUMMARY OF THE INVENTION

A first embodiment of the method according to the invention is characterized in that the correction signal is obtained by double integration of the difference between said incoming bitstream and one of the pre-filtered input signal and the outgoing bitstream of the ΣΔ-modulator over a certain number of bits and dividing the result of said double integration by said certain number of bits. This method is easy to implement either in hardware or in software. However a disadvantage of this method is, that the synchronization is less accurate and that a large number of signal-bits (e.g. 2000) is required for the ΣΔ-modulator to converge to the synchronized state. This disadvantage does not play a role in applications where enough data is available for synchronizing the ΣΔ-modulator. An important example of such application is in signal editing systems. In such system, even "future" data can be used, because the output of an editor can be delayed by an arbitrary amount.

In contradistinction herewith, in applications where much less data are available for achieving the bit-synchronization of the ΣΔ-modulator, such as in systems for compressing bitstream signals, the aforementioned, so called "least squares" method is not suitable and for those applications a second embodiment of the method of the invention is preferably used. This method is further characterized in that the correction signal is obtained by calculating the correction signal from the incoming bitstream and the pre-filtered input signal with an algorithm which is adapted to the structure of the low pass filter of the ΣΔ-modulator.

This method of the invention may conveniently be used for compression and expansion of bitstream signals in order to reduce the amount of storage in case the bitstream signal has to be stored on a storage medium or the bandwidth or transmission time in case the signal has to be transmitted. In this case the method of the invention is further characterized in that, in a system for compression and expansion of single bit bitstream signals, the correction signal is transferred from the compression side to the expansion side.

The invention also relates to an arrangement for synchronizing a ΣΔ-modulator which is characterized by a ΣΔ-modulator, a pre-filter for pre-filtering the incoming bitstream and applying a pre-filtered input signal to the ΣΔ-modulator, and a synchronizing unit for synchronizing the ΣΔ-modulator to the incoming bitstream by applying a correction signal to at least one of the integrator states of the ΣΔ-modulator, said synchronizing unit calculating the correction signal from the incoming bitstream and at least one of the pre-filtered input signal and the outgoing bitstream of the ΣΔ-modulator.

BRIEF DESCRIPTION OF THE DRAWING

The invention will be further explained with reference to the attached figures. Herein shows.

DESCRIPTION OF THE PREFERRED EMBODIMENTS

Figure 1:
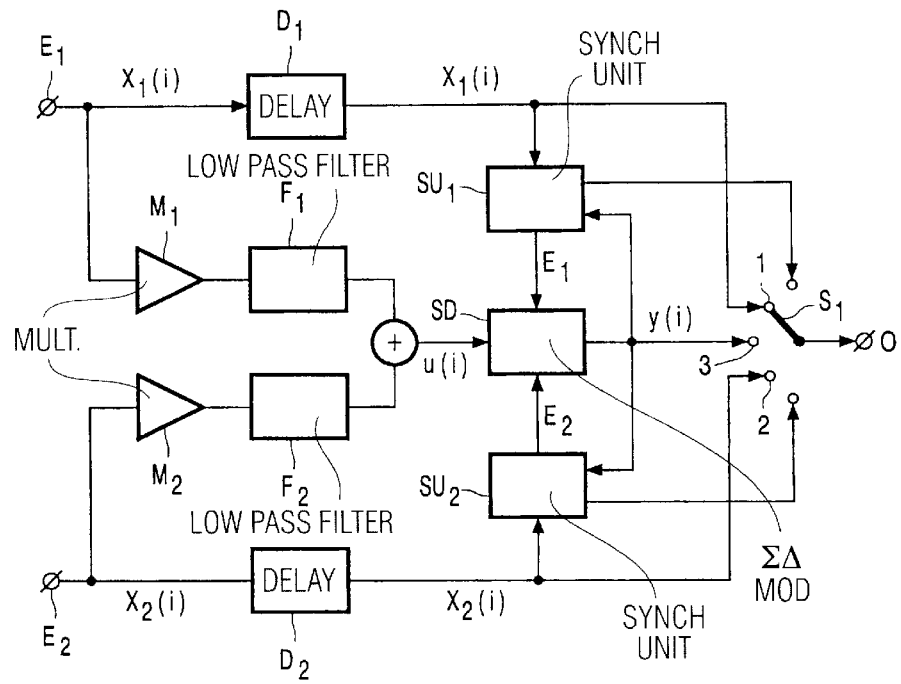
FIG. 1 a schematic diagram of an editing system using the method according to the invention, FIG. 2 a schematic diagram of a synchronization unit for use in the editing system of FIG. 1, FIG. 3 an example of a ΣΔ-modulator for use in connection with the method according to the invention, FIG. 4 a flow chart of an algorithm for use in a synchronization unit which cooperates with the ΣΔ-modulator of FIG. 3 and FIG. 5 a schematic diagram of a compression and expansion system using the method according to the invention.

The editing system of FIG. 1 comprises a first input $E_1$ for a first single bit bitstream $x_1(i)$, a second input $E_2$ for a second single bit bitstream $x_2(i)$ and an output O. The first input $E_1$ is connected through a first delay $D_1$ to a first position 1 of a switch S and through a first multiplier $M_1$ and a first low pass filter $F_1$ to an input of a ΣΔ-modulator SD. Equally is the second input $E_2$ connected through a second delay $D_2$ to a second position 2 of the switch S and through a second multiplier $M_2$ and a second lowpass filter $F_2$ to the input of the ΣΔ-modulator SD. It may be observed that the output signals of the multipliers are not any more single bit signals, but multi-bit signals. The ΣΔ-modulator delivers a single bit bitstream y(i) which is applied to a third position 3 of the switch S. The output terminal of the switch S constitutes the output O of the editing system.

For bit-synchronizing the ΣΔ-modulator to the first incoming bitstream, the editing system comprises a synchronization unit $SU_1$, which receives the, delayed, first bitstream $x_1(i)$ and the output bitstream y(i) of the ΣΔ-modulator. This synchronization unit supplies a correction signal $\epsilon_1$ to the first integrator state of the ΣΔ-modulator. Moreover the synchronization unit $SU_1$ supplies a switching signal to the switch S. Similarly, for bit-synchronizing the ΣΔ-modulator to the second bitstream, the editing system comprises a second synchronization unit $SU_2$ which receives the delayed second bitstream $x_2(i)$ and the output bitstream y(i) of the ΣΔ-modulator. This second synchronization unit $SU_2$ supplies a correction signal $\epsilon_2$ to the first integrator state of the ΣΔ-modulator and a switching signal to the switch S.

In operation, the switch S may be in the position 1 and the first input bitstream $x_1(i)$ from the first input $E_1$ is passed directly to the output O, be it delayed by delay $D_1$. Whenever a cross fade to the second bitstream must be made, the multiplier $M_1$ is set to 1 and the multiplier $M_2$ is set to zero. The multi-bit signals which originate from the two multipliers, are respectively passed through the low pass pre-filters $F_1$ and $F_2$ and subsequently added together and then supplied to the input of the ΣΔ-modulator. The purpose of the pre-filters $F_1$ and $F_2$ is to prevent that the high frequency components of the bitstreams $x_1(i)$ and $x_2(i)$ could reach the input of the ΣΔ-modulator. The ΣΔ-modulator needs a low frequency input, but the strong high frequency components of the bitstream could otherwise overload the ΣΔ-modulator which may then become unstable. Subsequently the requantized bitstream is synchronized to the original first bitstream by the synchronization unit $SU_1$ in a manner to be described afterwards with reference to FIG. 2. When the synchronization process is ready, the unit $SU_1$ changes the switch S to the position 3 so that the output stream is now the synchronized requantized version of the first input bitstream. From this moment, the gain factors of the multipliers $M_1$ and $M_2$ are changed according to the prescription of the cross fade. At the end of the fade, the gain factor of multiplier $M_1$ will be zero and that of multiplier $M_2$ will be one and the output stream is the requantized version of the second input bitstream. Now, the requantizer must be synchronised to the second input bitstream. This is performed by the second synchronization unit $SU_2$. However, because in this case the output is connected to the requantizer, the synchronization must be done in a very gentle way in order to avoid an audible click. In this case the integrator states of the ΣΔ-modulator are changed during e.g. 20.000 to 30.000 cycles, whereas the synchronization of the ΣΔ-modulator to the first bitstream could be performed abruptly. Finally, when the synchronization has been accomplished, the synchronization unit $SU_2$ switches the switch S to position 2 and the output stream is the, delayed, original second bitstream $x_2(i)$.

The editing process could be done more simple in "full requantization" mode by leaving the switch S in position 3 and deleting the second synchronization unit $SU_2$. Though this approach is algorithmically much easier, because it saves the second synchronization and eliminates any possibility of clicks, it has severe technical drawbacks. Most important: it would imply that the signal is subjected to multiple requantization, because each further editing would requantize an already requantized signal. Such multiple requantization would severely degrade the quality of the signal.

Figure 2:
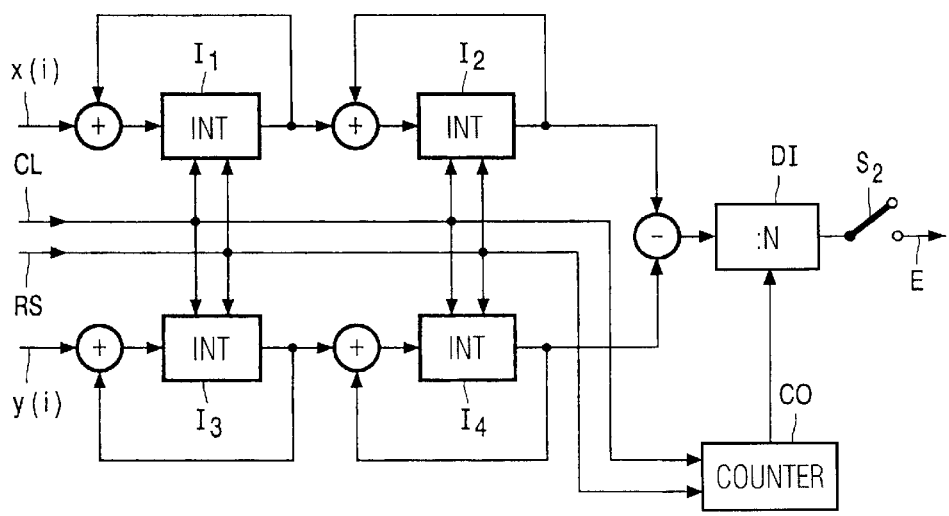

The synchronization unit depicted in FIG. 2 is based on the following algorithm for deriving the correction signal $\epsilon$:

$$\epsilon = \frac{1}{N} \sum_{n=1}^{N} \sum_{i=1}^{n} [x(i) - y(i)] \tag{1}$$

in which x(i) is the incoming bitstream to which the ΣΔ-modulator has to be synchronized and y(i) the outgoing bitstream delivered by the ΣΔ-modulator. Because the audio bands of the input signal u(i) of the ΣΔ-modulator and its output bitstream y(i) are substantially equal and because the algorithm of formula (1) has a low pass character, the signal u(i) can be applied to the synchronisation unit SU1 instead of the bitstream y(i). N is any suitable predetermined number (e.g. 5000), or, alternatively, N may be determined by the synchronization unit itself, when sufficient convergence is obtained, i.e. when the value of the correction signal ε is substantially constant.

FIG. 2 shows an arrangement for performing the algorithm of formula (1). This arrangement comprises a first cascade of integrators $I_1$ and $I_2$ for double integration of the incoming bitstream x(i) and a second cascade of integrators $I_3$ and $I_4$ for double integration of the outgoing bitstream y(i). Each integrator comprises a delay of one sample period whose output signal is added to its input. The outputs of the two cascades are subtracted from each other in a subtracter M and the output of the subtracter is divided by the number N in a DI. It may be clear, that alternatively the incoming and outgoing bitstreams may firstly be subtracted from each other and then twice integrated in a single cascade of integrators, in which case, however, the integrators should be able to handle multi bit signals.

A counter CO counts the sampling periods during which the synchronization unit is operative and delivers the number N to the divider DI. A clock pulse CL, which runs synchronously with the bits of the bitstreams, is applied to the integrators and to the counter. A reset pulse RS resets the counter and the integrators at the start of a new ε-determining cycle. A switch S2 connects the correction signal ε to the output of the synchronization unit, either when the counter N has reached the predetermined value, or when the correction signal ε has become sufficiently constant.

The algorithm of formula (1), which may be called the "least squares" algorithm, has the drawback that the synchronisation is less accurate and that it needs many bit-periods (e.g. 20000) before the synchronism is achieved. A more accurate and quicker synchronisation may be obtained with the "retrieval"-algorithm, which will be explained with reference to the flow chart of FIG. 4 in connection with the internal circuit diagram of the ΣΔ-modulator, depicted in FIG. 3. It may be noted that the ΣΔ-modulator, shown in FIG. 3, is known in the art and does in itself not constitute an invention, but represents a preferred embodiment of a ΣΔ-modulator with which the present invention may be used.

Figure 3:
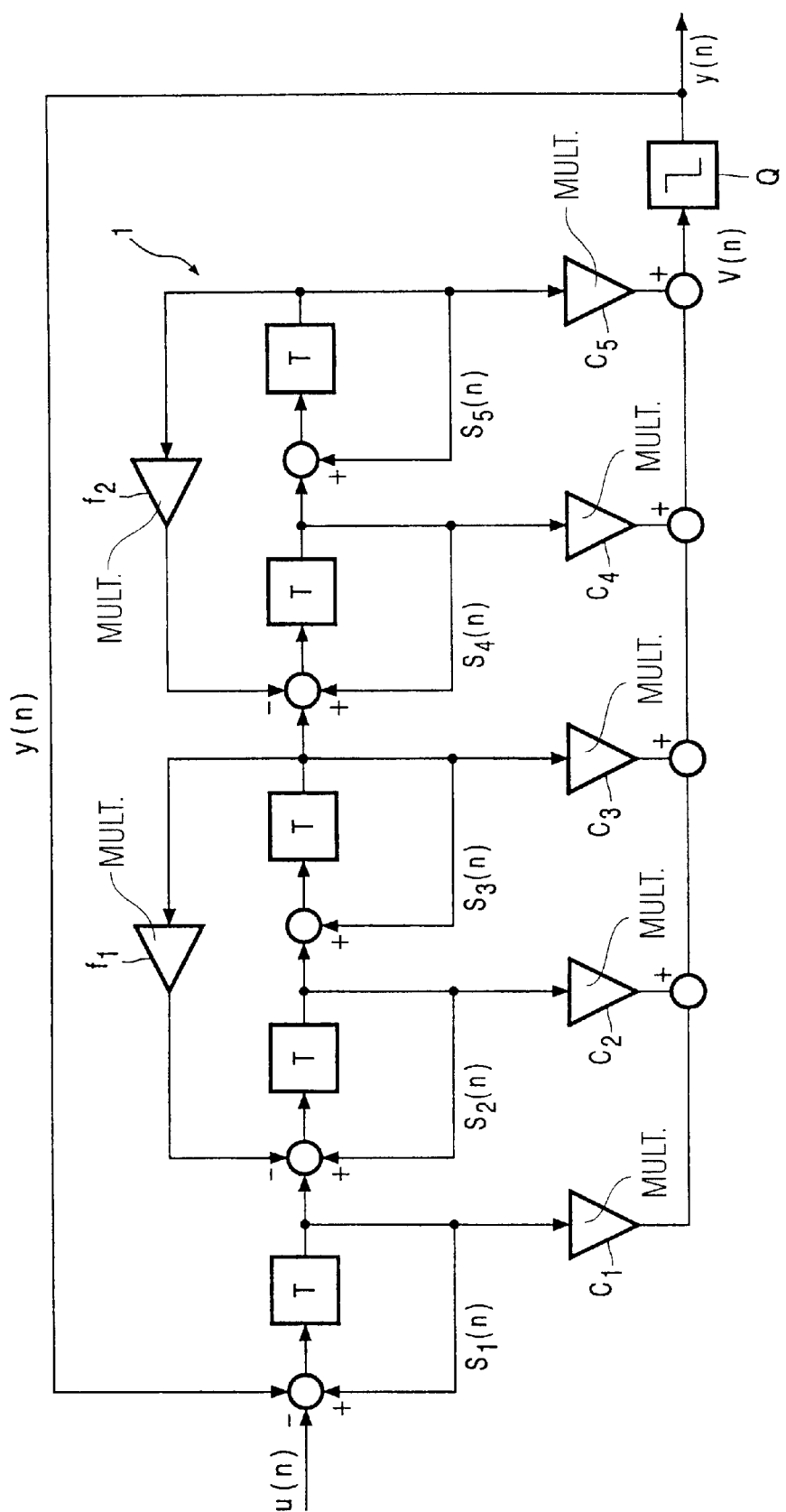

The arrangement of FIG. 3 comprises a digital low pass filter F and a quantizer Q. An input signal u(n) is fed to the input of the low pass filter F. The output v(n) of the low pass filter is fed to the quantizer Q and the output y(n) of the quantizer, which constitutes the output of the ΣΔ-modulator, is fed back to the input of the low pass filter.

The low pass filter F comprises the cascade of five integrators, each of which has its output added to its input signal and whose output signals are denoted respectively by $S_1(n)$, $S_2(n)$, $S_3(n)$, $S_4(n)$ and $S_5(n)$. A first feedback multiplier feeds the output $S_3(n)$ of the third integrator, multiplied by feedback coefficient $f_1$, back to the input of the second integrator and a second feedback multiplier feeds the output $S_5(n)$ of the fifth integrator, multiplied by a feedback coefficient $f_2$, back to the input of the fourth integrator. The outputs of the five integrators $S_1(n)$ ... $S_5(n)$ are added together, each through a multiplier with coefficient $c_1$ ... $c_5$ to constitute the output v(n) of the low pass filter The signals, processed in the respective parts of the low pass filter are all multi bit signals. However the quantizer Q outputs only the sign bit of its input signal v(n), so that the output signal y(n) is single-bit.

The generation of the signal v(n) by the multipliers with coefficients $c_1$ ... $c_5$ may be described by the following equation:

$$v(n) = \sum_{i=1}^{5} c_i s_i(n) \quad (2)$$

and the operation of the quantizer Q may be described by the equation:

$$y(n) = \text{sign}(v(n))$$

Furthermore the operation of the five integrators is expressed by the following set of five equations:

$$s_1(n+1) = s_1(n) + u(n) - y(n)$$

$$s_2(n+1) = s_1(n) + s_2(n) - f_1 s_3(n)$$

$$s_3(n+1) = s_2(n) + s_3(n)$$

$$s_4(n+1) = s_3(n) + s_4(n) - f_2 s_5(n)$$

$$s_5(n+1) = s_4(n) + s_5(n) \quad (3)$$

To facilitate the further calculation, the following vectors, each of the order five, are introduced: $s(n) = (s_1(n), s_2(n), s_3(n), s_4(n), s_5(n))$ $c(n) = (c_1, c_2, c_3, c_4, c_5)$ which describe the values of the multipliers $c_1$ ... $c_5$. $d = (1, 0, 0, 0, 0)$ which describes how the input and the feedback are distributed.

Furthermore a transformation matrix A is introduced, which describes the structure of the integrators and the feedback multipliers $f_1$ and $f_2$. For the exemplary embodiment of FIG. 3 the matrix A has the following elements:

$$A = \begin{pmatrix} 1 & 0 & 0 & 0 & 0 \\ 1 & 1 & -f_1 & 0 & 0 \\ 0 & 1 & 1 & 0 & 0 \\ 0 & 0 & 1 & 1 & -f_2 \\ 0 & 0 & 0 & 1 & 1 \end{pmatrix} \quad (5)$$

Herewith the equations 2 and 4 become respectively:

$$v(n) = c^T \cdot s(n) \quad (6)$$

$$s(n+1) = A \cdot s(n) + (u(n) - y(n)) \cdot d \quad (7)$$

Repetitive application of (7) to calculate s(n) as a function of the initial integrator states s(0) gives the equation:

$$s(n) = A^n \cdot s(0) + \left[ \sum_{i=0}^{n-1} (u(i) - y(i)) A^{n-i-1} \right] \cdot d \quad (8)$$

And this leads, with (3) and (6) to the following set of inequalities:

$$\pm c^T \cdot A^n \cdot s(0) > \pm c^T \cdot \left[ \sum_{i=0}^{n-1} (u(i) - y(i)) A^{n-i-1} \right] \cdot d \text{ if } y(n) = \pm \quad (9)$$

or

-continued $$y(n)c^T \cdot A^n \cdot s(0) > -y(n)c^T \cdot \left[\sum_{i=0}^{n-1}(u(i)-y(i))A^{n-i-1}\right] \cdot d$$

This set of inequalities gives a relation between the input signal u(n), the output bitstream y(n) and the integrator states s(0) of the $\Sigma\Delta$-modulator. As it is the purpose of the synchronisation algorithm to make the outgoing bitstream y(n) equal to the incoming bitstream x(n), the set of inequalities can be used in the algorithm, when in this set y(n) is replaced by x(n), then, with given input signals x(n) and u(n), have the algorithm calculate the integrator states s(0) and then feed the calculated integrator states to the $\Sigma\Delta$-modulator.

Figure 4:
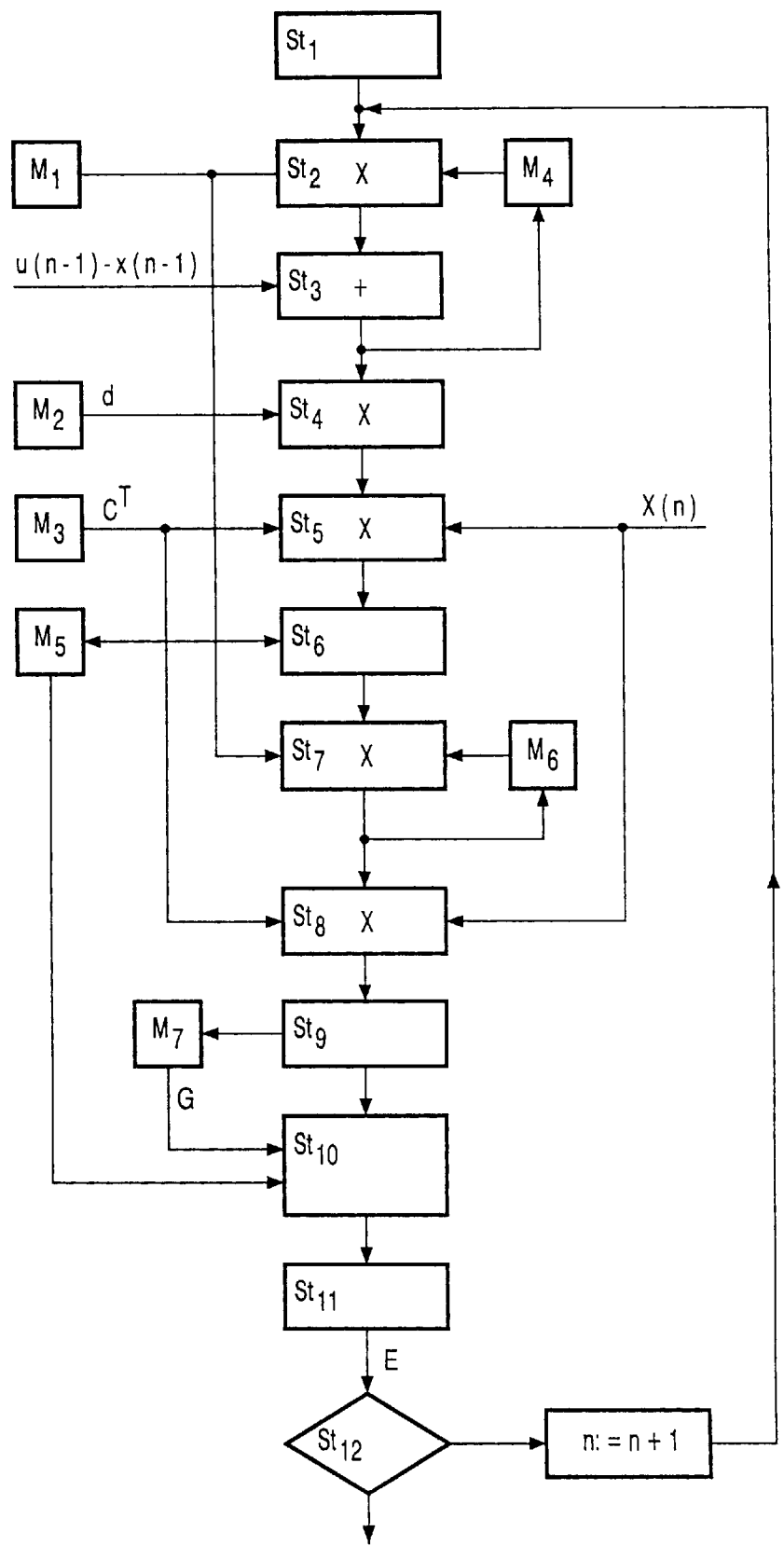

The flow diagram of FIG. 4 explains this algorithm. The flow diagram contains a number of processing steps $St_1 \ldots St_{11}$ and three read-only memories $M_1$, $M_2$, $M_3$. The memory $M_1$ contains the matrix A, the memory $M_2$ the vector d and the memory $M_3$ the vector $c^T$. These memories, therefore, contain the structure of the low pass filter. Further memories $M_4 \ldots M_7$ are read/write memories.

The step $St_1$ provides the initialisation. In particular: the counter n is set to n=1, the matrix memory $M_4$ is set to zero (i.e. all the elements of the matrix are set to zero) and the matrix memory $M_6$ is set to 1 (i.e. the elements of the main diagonal are set to 1 and the remaining elements are set to zero).

The step $St_2$ is a matrix multiplication which multiplies the contents of $M_1$ and $M_4$.

The step $St_3$ adds the difference of in- and output signals u(n−1)−x(n−1) at the instant n−1 to the result of step $St_2$ and stores the result of this addition into $M_4$. Therefore, when n=1, the result of step $St_2$ is zero because it multiplies the matrix A from $M_1$ with the zero matrix in $M_4$. The result of the addition in step $St_3$ is (u(0)−x(0)) and this is stored in $M_4$. At the next instant, when n=2, the content of $M_4$ is again multiplied with the matrix A, so that step St2 delivers (u(0)−x(0))A en $St_3$ delivers (u(0)−x(0))A+(u(1)−x(1)). When n=3 $St_3$ delivers (u(0)−x(0))A²+(u(1)−x(1))A+(u(2)−x(2)), and so on. When general result of step $St_3$ therefore is a matrix, which is equal to:

$$\sum_{i=0}^{n-1}(u(i)-x(i))A^{n-i-1}$$

In step $St_4$ this matrix transforms the vector d from $M_2$ to the new vector:

$$\left[\sum_{i=0}^{n-1}(u(i)-x(i))A^{n-i-1}\right] \cdot d$$

In step $St_5$ this vector is multiplied with the vector $c^T$ in $M_3$ and with x(n) to obtain the scalar value:

$$x(n)c^T \cdot \left[\sum_{i=0}^{n-1}(u(i)-x(i))A^{n-i-1}\right] \cdot d$$

In step $St_6$ this value is stored in memory $M_5$ to constitute a vector h of n elements, which for each instant n increases by one element.

In step $St_7$ the matrix A is multiplied by the matrix contained in memory $M_6$. At the instant n=1 the memory $M_6$ contains the matrix 1 by initialisation, so that the result of step $St_7$ is A. This result is stored in $M_6$. At the next instant n=2, step $St_7$ multiplies the matrix A from M5 with the matrix A contained in $M_6$, so that the result of this step is $A^2$. Generally, the result of $St_7$ is $A^n$.

In step $St_8$ the matrix $A^n$ is multiplied with the vector $c^T$ in $M_3$ and with x(n) to obtain the the vector $x(n).c^T.A^n$ In step $St_9$ this vector $x(n).c^T.A^n$ is stored in memory $M_7$ to constitute a matrix G having one dimension which is equal to the length of the vector (e.g.=5) and whose other dimension is equal to n.

In step $St_{10}$ the n'th estimate $\_^n(0)$ is calculated. This is done subject to the n inequalities of relation (9) G.$\_^n(0)$>h with the contents of $M_5$ and $M_7$. The larger n is, the more inequalities are taken into account and the narrower the solution area for $\_^n(_0)$ will be. But a plurality of solutions will remain. A single estimate of the initial integrator states of the $\Sigma\Delta$-modulator may be found by choosing $|\_^n(0)|$= min!. This step is known as the solution of the quadratic programming problem and is known per se, e.g. from Lawson, C. L. and Hanson, R. J. "Solving least squares problems", Prentice Hall, 1974, which is herein incorporated by reference.

In step $St_{11}$ the difference $\epsilon=|\_^{n-1}(0)-\_^n(0)|$ between the newly found n'th estimate $\_^n(0)$ and the previously found n−1'th estimate $\_^{n-1}(0)$ is calculated. When this difference $\epsilon$ is not yet sufficiently small, the counter is increased (n:=n+1) and the algorithm returns to step $St_2$. If the difference $\epsilon$ is sufficiently small, the algorithm multiplies the vector $\_^n(0)$, found in step $St_{10}$, with the output $A^n$ of step $St_7$ and the result of this multiplication is added to the result of step $St_4$ (these steps are not shown in the flow diagram of FIG. 4). Formula (8) above shows that the result of this operation is the estimate $_{13}(n)$ i.e. the calculated value of the integrator states at the instant n. These integrator states are impressed on the respective low pass sections of the $\Sigma\Delta$-modulator, which brings the bitstream generated by the $\Sigma\Delta$-modulator in synchronism with the input bitstream x(n).

Figure 5:
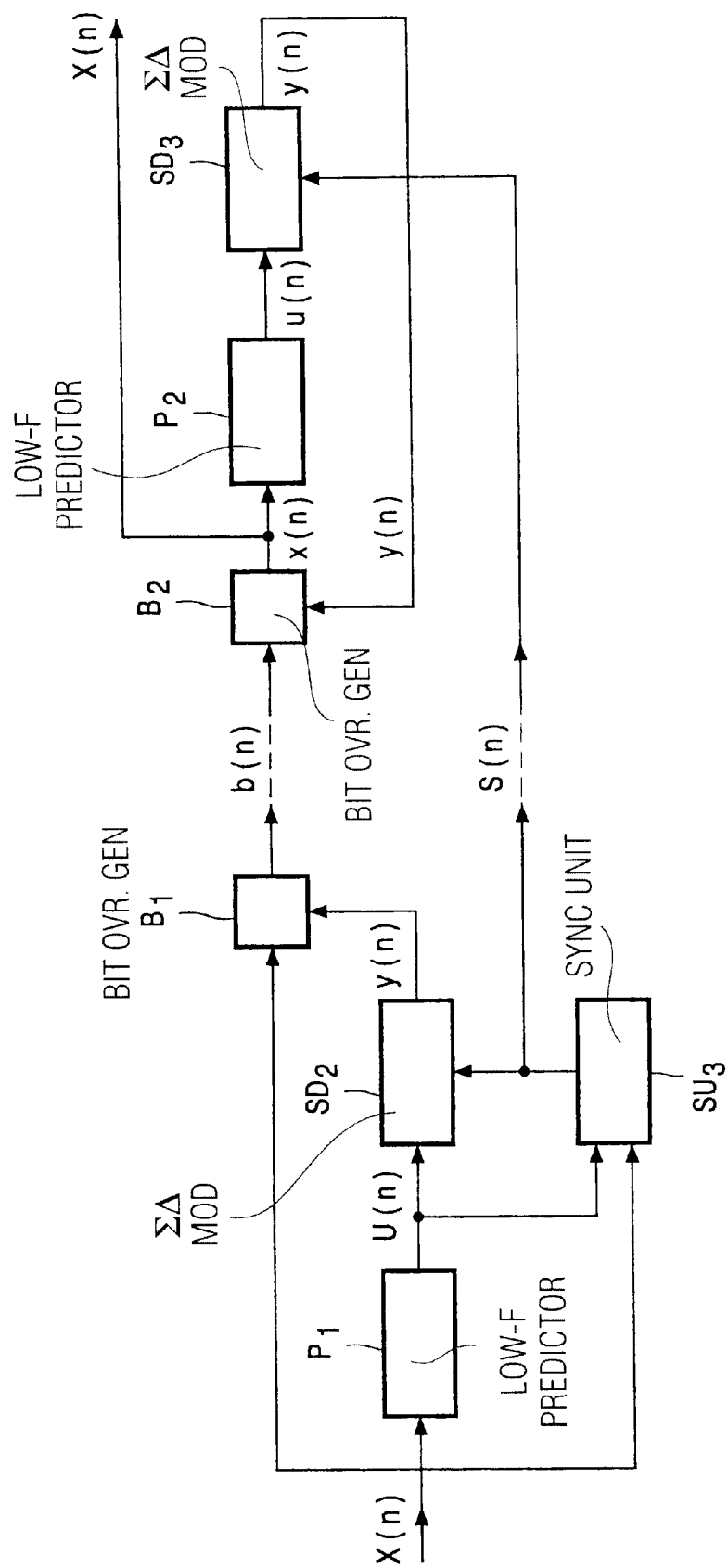

FIG. 5 shows an application in which the algorithm of FIG. 4 may preferably be used. This application is a system for compressing and decompressing a single bit bitstream, in order to minimize the bandwidth in transmission or the amount of storage capacity in storing the bitstream signal.

In the compressor part of FIG. 5 the incoming single bit bitstream x(n) is applied to a low frequency predictor $P_1$, which transfers the input bitstream without delay to a low frequency digital signal u(n). This LF-signal u(n) is subsequently applied to a $\Sigma\Delta$-modulator $SD_2$. A synchronisation unit $SU_3$ receives the incoming bitstream x(n) and the LF-signal u(n) and delivers integrator state updates s(n) to the $\Sigma\Delta$-modulator. This action is preferably done with the algorithm described with reference to the flow diagram of FIG. 4, because this algorithm is accurate and fast. The output bitstream y(n) of the $\Sigma\Delta$-modulator and the incoming bitstream are both applied to a bit-overrule generator $B_1$, which generate a zero when both bitstreams are equal and which passes x(n) when x(n) and y(n) are unequal. When the $\Sigma\Delta$-modulator is correctly synchronised the two bitstreams are equal and the unit B1 will generate a stream of zeros. The unit $B_1$, therefore, generates an error signal in case the synchronisation is not correct.

The integrator state updates s(n) and the error signal b(n) are transferred through any transmission or storage medium to the expander part. It may be noted that for this transfer the two signals may be further compressed in any manner known in the art. For instance, because the error signal b(n) usually has a lot of zero's, the signal can advantageously be further compressed by entropy coding.

In the expander-part of FIG. 5 the integrator state updates s(n) are applied to an ΣΔ-modulator $SD_3$, whose output bitstream y(n) is applied, together with the received error signal b(n) to a bit-overrule receiver $B_2$. This unit generates a bitstream which is (likely) equal to x(n), because it passes the bitstream y(n) to its output in case there is no error between y(n) and x(n) and in the other case it passes b(n)=x(n). The bitstream x(n) is applied, to a predictor $P_2$, which is preferably identical to the predictor $P_1$ of the compressor, and the output of the predictor $P_2$ is a low frequency signal u(n) which is applied to the input of the ΣΔ-modulator $SD_3$. It is noted that in the compressor part and in the expander part of FIG. 5 the same signal-references x(n), y(n) and u(n) have been used, in order to clearly indicate that corresponding elements receive corresponding signals. Of course, when the ΣΔ-modulators are not yet correctly synchronized, the corresponding signals at the compressor side and the expander side may differ.

It should be observed that the main signal stream between compressor and expander is formed by the integrator state updates s(n). The compression rate of the described system is particularly effective because a new set of integrator state updates need not be transmitted each sampling period of the bitstream. This is a matter of compromise: less s(n)-updates result in more bit-overrules b(n). On the other hand, many s(n)-updates result in a 'perfect'-synchronization and no bit-overrules.

What is claimed is:

1. A method of synchronizing a ΣΔ-modulator comprising a low pass filter and a quantizer in a feedback arrangement to an incoming single-bit bitstream, comprising the steps of generating a correction signal and applying said correction signal to one of a plurality of integrator stages of the low pass filter, pre-filtering the incoming bitstream (x(n)) prior to application to the ΣΔ-modulator and generating the correction signal ($\epsilon$, s(n)) from a pre-filtered input signal (u(n)) and an outgoing bitstream (y(n)) of the ΣΔ-modulator.

2. A method as claimed in claim 1 characterized in that the correction signal ($\epsilon$) is obtained by double integration of the difference between said incoming bitstream (x(n)) and one of the pre-filtered input signal (u(n)) and the outgoing bitstream (y(n)) of the ΣΔ-modulator over a certain number of bits and dividing the result of said double integration by said certain number of bits.

3. A method as claimed in claim 1 characterized in that the correction signal is obtained by calculating the correction signal ($\epsilon$, s(n)) from the incoming bitstream (x(n)) and the pre-filtered input signal (u(n)) with an algorithm which is adapted to the structure of the low pass filter of the ΣΔ-modulator.

4. A method as claimed in claim 1 characterized in that, in a system for compression and expansion of single bit bitstream signals, the correction signal ($\epsilon$, s(n)) is transferred from the compression side to the expansion side.

5. An arrangement for performing the method of claim 1, characterized by the ΣΔ-modulator (SD), the pre-filter (F,P) for pre-filtering the incoming bitstream and applying the pre-filtered input signal to the ΣΔ-modulator, and a synchronizing unit (SU) for synchronizing the ΣΔ-modulator to the incoming bitstream by applying the correction signal ($\epsilon$, s(n)) to one of the plurality of integrator stages of the ΣΔ-modulator, said synchronizing unit (SU) calculating the correction signal ($\epsilon$, s(n)) from the incoming bitstream (x(n)) and the pre-filtered input signal (u(n)) and the outgoing bitstream (y(n)) of the ΣΔ-modulator.

* * * * *